(12) United States Patent
Hosokawa (10) Patent No.: US 8,907,732 B2
(45) Date of Patent: Dec. 9, 2014

(54) OSCILLATION FREQUENCY REGULATING CIRCUIT AND METHOD

(71) Applicant: Lapis Semiconductor Co., Ltd., Tokyo (JP)

(72) Inventor: Hirokazu Hosokawa, Tokyo (JP)

(73) Assignee: Lapis Semiconductor Co., Ltd., Yokohama (JP)

( * ) Notice: Subject to any disclaimer, the term of this patent is extended or adjusted under 35 U.S.C. 154(b) by 53 days.

(21) Appl. No.: 13/758,321

(22) Filed: Feb. 4, 2013

(65) Prior Publication Data

US 2013/0222074 A1  Aug. 29, 2013

(30) Foreign Application Priority Data

Feb. 28, 2012 (JP) ................. 2012-042138

(51) Int. Cl.
*H03K 3/02* (2006.01)
*H03L 7/00* (2006.01)
*H03L 7/091* (2006.01)
*H03K 3/0231* (2006.01)

(52) U.S. Cl.
CPC ...... *H03L 7/00* (2013.01); *H03L 7/091* (2013.01); *H03K 3/0231* (2013.01); *H03L 2207/50* (2013.01)
USPC .......................... 331/143; 331/111; 327/291

(58) Field of Classification Search
CPC ........... H03L 1/022; H03L 7/08; H03L 7/085; H03L 1/00; H03L 1/02; H03L 1/026; H03L 2207/50; H03L 5/00; H03L 7/00; H03L 7/16; H03L 7/087; H05B 33/0821; H05B 33/0842; H05B 37/0254; H03K 3/0231
USPC .............. 331/34, 16, 177 R, 111, 143, 117 R, 331/117 FE, 167; 327/291
See application file for complete search history.

(56) References Cited

U.S. PATENT DOCUMENTS 7,852,099 B1 * 12/2010 Clark ....................... 324/762.02

FOREIGN PATENT DOCUMENTS

JP  2001-285056  10/2001

* cited by examiner

*Primary Examiner* — Arnold Kinkead
(74) *Attorney, Agent, or Firm* — Volentine & Whitt, PLLC (57) ABSTRACT

There is provided an oscillation frequency regulating circuit including: a measuring section that performs measurement based on an oscillation frequency of an oscillation circuit; a comparator section that compares a measurement value measured by the measuring section against a set comparison value over a set comparison duration; a setting section that sets a comparison value selected from a plurality of comparison values of different magnitudes and that sets in the comparator section the comparison duration according to the magnitude of the selected comparison value; and a regulation section that, based on the comparison result of the comparator section, regulates the oscillation frequency of the oscillation circuit such that the oscillation frequency that is measured by the measuring section becomes a target oscillation frequency.

8 Claims, 9 Drawing Sheets

| TRIMMING VALUE (li_trm3,li_trm2,li_trm1,li_trm0) | FREQUENCY |
|---|---|
| 0111 | FAST |
| ⋮ | |
| 0010 | |
| 0001 | |
| 0000 | |
| 1111 | |
| ⋮ | |
| 1000 | SLOW |

US 8,907,732 B2

OSCILLATION FREQUENCY REGULATING CIRCUIT AND METHOD

CROSS-REFERENCE TO RELATED APPLICATION

This application is based on and claims priority under 35 USC 119 from Japanese Patent Application No. 2012-042138 filed on Feb. 28, 2012, the disclosure of which is incorporated by reference herein.

BACKGROUND

1. Technical Field

The present invention relates to technology for regulating the oscillation frequency of an oscillation circuit, and for example to an oscillation frequency regulating circuit, a semiconductor device, an electronic device, and an oscillation frequency regulation method suitable for performing high precision regulation quickly.

2. Related Art

A trimming circuit is provided in an oscillation circuit for automatic regulation of the oscillation frequency of an oscillator. For example an automatic trimming circuit for an oscillator is disclosed in Japanese Patent Application Laid-Open (JP-A) No. 2001-285056. The trimming circuit is equipped with: a variable frequency CR oscillation circuit of comparatively low oscillation frequency precision; a quartz oscillation circuit of comparatively high oscillation frequency precision; a control logic circuit that generates a latch signal at a specific timing based on the oscillation frequency of the quartz oscillation circuit; a counter that counts an output clock signal of the CR oscillation circuit; and a data comparator circuit that compares counter output data of the counter latched to the latch signal against specific reference data, outputs a binary m-bit trimming signal that varies according to the difference between both inputs so as to control to change the oscillation frequency of the CR oscillation circuit, and stops control operation when the difference between both inputs is within a determined range.

Figure 7:
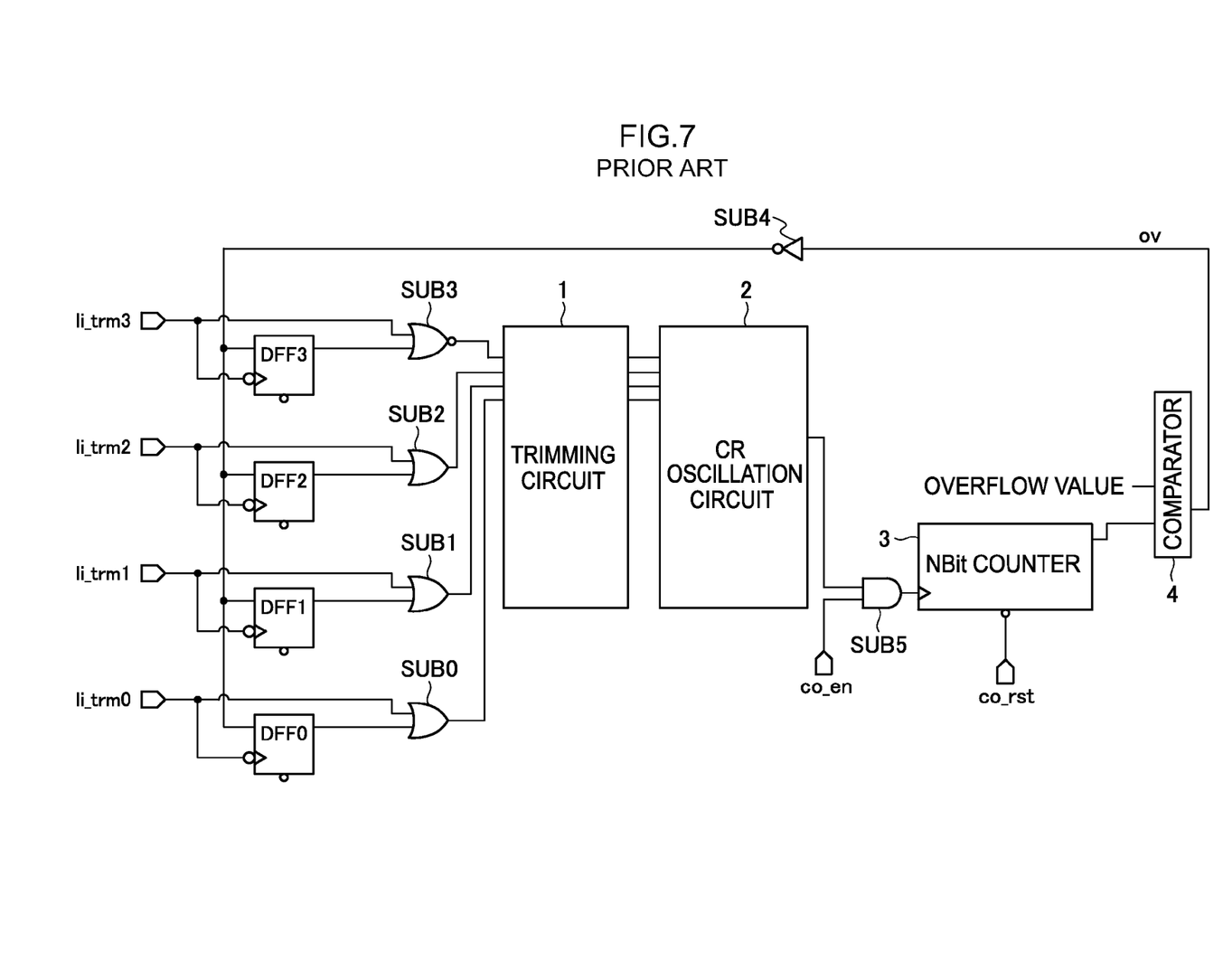
FIG. 7 is a circuit diagram illustrating an example of a configuration of a related oscillation frequency regulating circuit.
Figure 8:
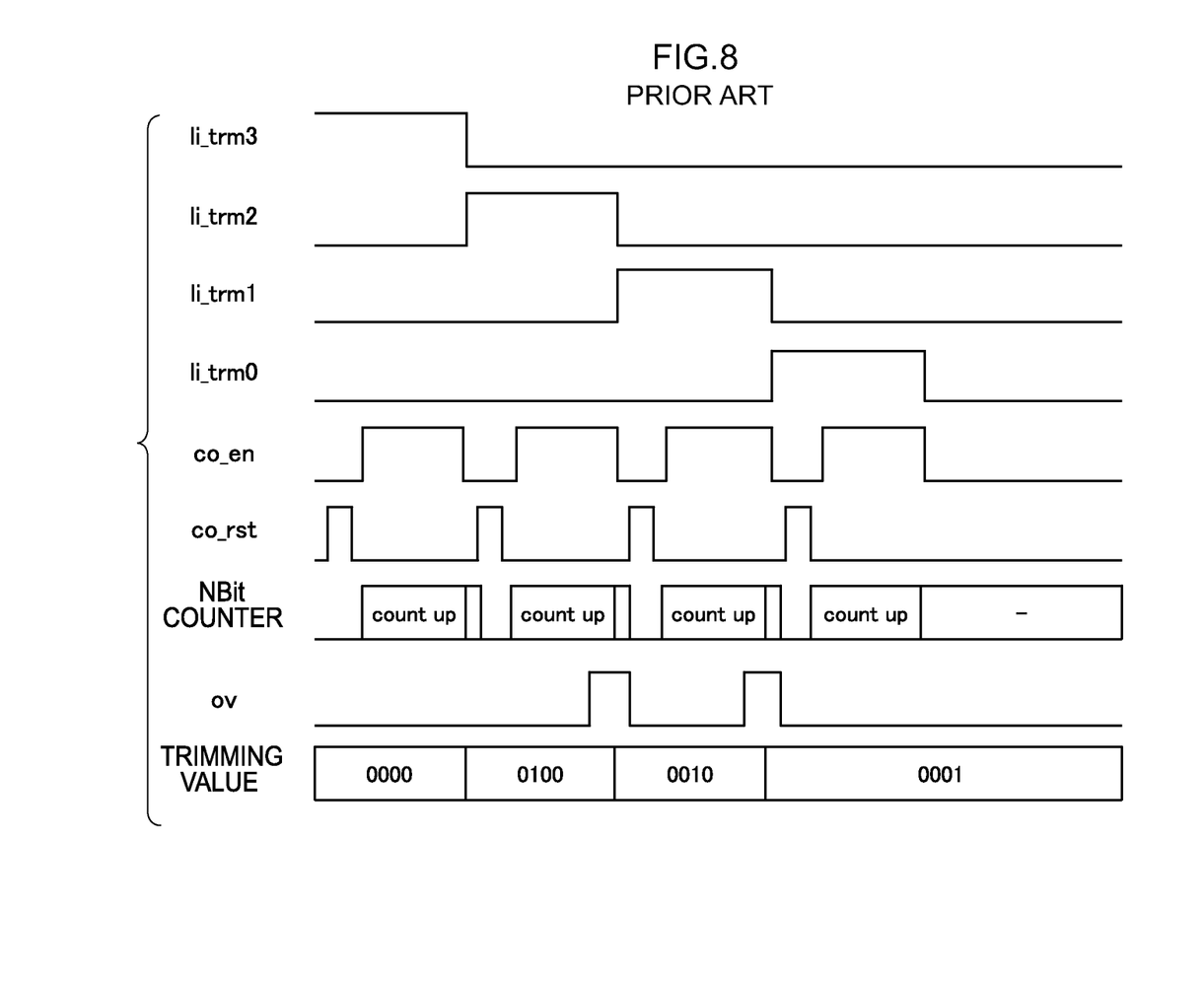
FIG. 8 is a timing chart illustrating an example of operation of the oscillation frequency regulating circuit of FIG. 7.

Explanation follows regarding configuration and operation of a related oscillation frequency regulating circuit that regulates the oscillation frequency of an oscillator using a trimming signal, with reference to FIG. 7 and FIG. 8.

As illustrated in FIG. 7, an oscillation frequency regulating circuit for regulating the oscillation operation of a CR oscillation circuit 2 is configured including a trimming circuit 1, a NBit counter (referred to below simply as counter) 3, a comparator 4, D flip-flop circuits (referred to below simply as flip-flops) DFF0 to DFF3, a NOR circuit (logical NOT-OR operation circuit) SUB 3, a OR circuits (logical OR circuits) SUB 0 to SUB 2, a NOT circuit (NOT circuit) SUB 4, and an AND circuit (logical AND circuit) SUB 5.

Due to the above configuration, the related oscillation frequency regulating circuit operates the counter 3 for a fixed duration count according to the clock of the CR oscillation circuit 2, performs overflow determination in the comparator 4 based on a comparison of count result data of the counter 3 against a predetermined overflow value, and determines a trimming value for employing to regulate the oscillation frequency of the CR oscillation circuit 2 based on results of overflow determination.

In FIG. 7, for example 4-bit trimming setting values of li_trm3, li_trm2, li_trm1 and li_trm0 input from an external device such as a tester connected during oscillation frequency regulation are respectively input as clocks to the flip-flops DFF3 to DFF0, and also input as one of the inputs of the NOR circuit SUB 3, the OR circuit SUB 2, the OR circuit SUB 1, and the OR circuit SUB 0.

Note that in this example the highest order bit trimming setting value is li_trm3, and the lowest order bit trimming setting value is li_trm0.

The respective outputs of the flip-flops DFF3 to DFF0 are input to the other inputs of the NOR circuit SUB 3 and the OR circuits SUB 2 to SUB 0.

The respective outputs of the NOR circuit SUB 3 and the OR circuits SUB 2 to SUB 0 are input as data inputs to the trimming circuit 1.

A counter operation duration setting signal employed to control the counter operation duration of the counter 3 is shown as co_en. The counter operation duration setting signal co_en is input as one of the inputs to the AND circuit SUB 5, and the output of the CR oscillation circuit 2 is input as the other input to the AND circuit SUB 5.

The output of the AND circuit SUB 5 is input as the clock input to the counter 3, and a co_rst signal is input from an external device to the counter 3 as a reset signal.

The output of the counter 3 is input as one input to the comparator 4, and the output of the comparator 4 is input to the NOT circuit SUB 4. The output of the NOT circuit SUB 4 is input as data input respectively to the flip-flops DFF3 to DFF0.

Explanation follows regarding automatic trimming operation of the oscillation frequency regulating circuit configured as described above, with reference to a timing chart that is illustrated in FIG. 8.

Figure 9:
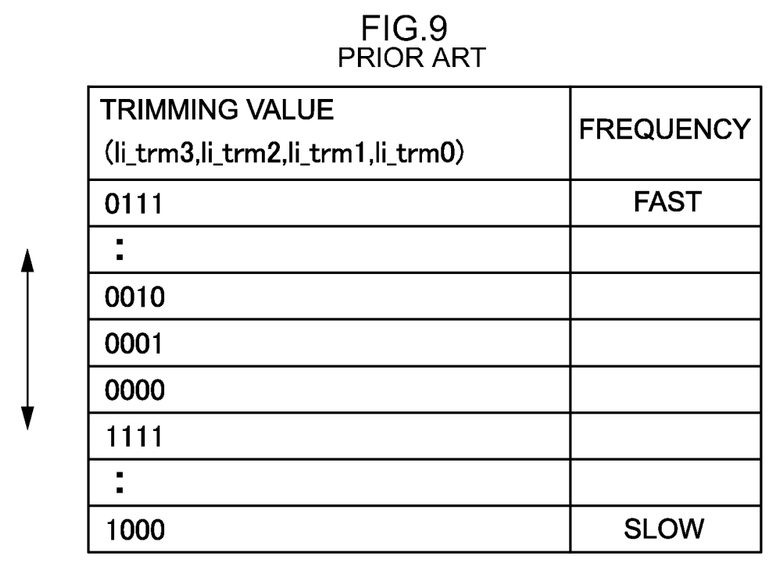
FIG. 9 is a schematic diagram illustrating a configuration of data representing relationships between trimming values and frequencies.

Note that the relationship between the trimming value and the oscillation frequency is, as schematically illustrated in FIG. 9, such that the oscillation frequency becomes the highest (fastest) when the value input to the trimming circuit 1 corresponding to the highest order bit trimming setting value li_trm3 is "0" and the values input to the trimming circuit 1 corresponding to each of the following bit trimming setting values li_trm2 to li_trm0 are "1" ("0111"), such that the oscillation frequency becomes the lowest (slowest) when the value input to the trimming circuit 1 corresponding to the highest order bit trimming setting value li_trm3 is "1" and the values input to the trimming circuit 1 corresponding to each of the following bit trimming setting values li_trm2 to li_trm0 are "0" ("1000"), and such that the oscillation frequency is an intermediate frequency when the trimming setting values li_trm3 to li_trm0 are all "0".

In FIG. 7, when first the trimming setting value li_trm3 is input as "H", namely "1", and the trimming setting values li_trm2 to li_trm0 are input as "L", namely "0", the trimming circuit 1 is input with "0000" as the trimming value by the flip-flops DFF3 to DFF0, the NOR circuit SUB 3 and the OR circuits SUB 2 to SUB 0.

For example, this state is an initial state after each of the flip-flops DFF3 to DFF0 have been reset, and when the trimming setting value li_trm3 is made "H (1)" without operating each of the flip-flops DFF3 to DFF0, then only the trimming setting value li_trm3 "H (1)" and the trimming setting values li_trm2 to li_trm0 "L (0)" are input to the NOR circuit SUB 3 and the OR circuits SUB 2 to SUB 0, the trimming setting value li_trm3 "H (1)" is inverted in the NOR circuit SUB 3 to "L (0)", and as a result the trimming value "0000" is input to the trimming circuit 1.

Based on this input trimming value, the trimming circuit 1 generates a control signal employed to regulate circuit elements such as resistors and capacitors in the CR oscillation circuit 2 used to set the oscillation frequency, and outputs the control signal to the CR oscillation circuit 2. The CR oscillation circuit 2 accordingly oscillates at the intermediate frequency corresponding to the trimming value "0000".

In this state, an external device operates the counter 3 for a predetermined duration (referred to below simply as a specific duration) by making the counter operation duration setting signal co_en "H (1)", and the counter 3 counts (measures) the oscillation frequency of the CR oscillation circuit 2.

The counter values of the counter 3 are serially input to the comparator 4 and the comparator 4 compares the counter values of the counter 3 against an overflow value. When the "counter value>overflow value" occurs within the specific duration, the comparator 4 outputs "H (1)" as an overflow signal ov. Note that the output of the comparator 4 remains at "L (0)" when "counter value>overflow value" does not occur within the specific duration.

The counter operation duration setting signal co_en is made "L (0)" when the specific duration has elapsed, thereby stopping the counter operation of the counter 3.

In FIG. 8, when the trimming value "0000" is input, the counter value of the counter 3 does not reach the overflow value within the specific duration, and the overflow signal ov output from the comparator 4 is "L (0)".

This output is inverted in the NOT circuit SUB 4 to "H (1)", and input to the respective data input terminals of the flip-flops DFF3 to DFF0.

In this state, the trimming setting value from the external device is shifted from the higher order values in the counter operation duration of the counter 3 for the specific duration at the next time of regulation. Specifically, the trimming setting value li_trm3 is changed to "L (0)" and the trimming setting value li_trm2 is changed to "H (1)".

When the trimming setting value li_trm3 and the trimming setting value li_trm2 are changed in this manner, the flip-flop DFF3 and the flip-flop DFF2 are latched to output "H (1)" from the NOT circuit SUB 4 being input to their data input terminals, and "H (1)" is output to the NOR circuit SUB 3 and the OR circuit SUB 2.

The output of the NOR circuit SUB 3 is thereby made "L (0)" and the output of the OR circuit SUB 2 is thereby made "H (1)", and "0100" is input as the trimming value to the trimming circuit 1. As a result the CR oscillation circuit 2 oscillates at an oscillation frequency intermediate between the trimming value "0000" and the trimming value "0111".

Namely, with oscillation at the intermediate oscillation frequency corresponding to the trimming value "0000", since the counter value of the counter 3 does not reach the overflow value, the CR oscillation circuit 2 is caused to oscillate faster than oscillation at the intermediate frequency corresponding to trimming value "0000", and at an intermediate frequency between those corresponding to the trimming value "0000" and the trimming value "0111".

At this trimming value setting, as illustrated in FIG. 8, an "H (1)" overflow signal ov is output from the comparator 4 when the counter value of the counter 3 reaches the overflow value within the specific duration.

The overflow signal ov (H) from the comparator 4 is inverted by the NOT circuit SUB 4 to "L (0)", and input to the respective data input terminals of each of the flip-flops DFF3 to DFF0.

Similarly, when in this state, the trimming setting value is shifted in the counter operation duration of the counter 3 of the specific duration at the next time of regulation, and the trimming setting value li_trm2 is changed to "L (0)" and the trimming setting value li_trm1 is changed to "H (1)".

When the trimming setting value li_trm2 and the trimming setting value li_trm1 are changed in this manner, the flip-flop DFF2 and the flip-flop DFF1 are latched to the output "L (0)" from the NOT circuit SUB 4 that is being input to their data input terminals, and "L (0)" is output to the OR circuit SUB 2 and the OR circuit SUB 1.

The output of the OR circuit SUB 2 thereby is made "L (0)", and the output of the OR circuit SUB 1 that is being input to one input terminal with the trimming setting value li_trm1 of "H (1)" is made "H (1)", and the trimming circuit 1 is input with "0010" as the trimming value.

As a result the CR oscillation circuit 2 then oscillates this time at an intermediate frequency to those corresponding to the trimming value "0000" and the trimming value "0100".

Namely, when oscillating at the frequency corresponding to the trimming value "0100", since the counter value of the counter 3 reaches the overflow value within the specific duration, the CR oscillation circuit 2 is caused to oscillate slower than oscillation at the frequency corresponding to the trimming value "0100" and at a frequency intermediate between those corresponding to the trimming value "0000" and the trimming value "0100".

When set at this trimming value ("0010"), as illustrated in FIG. 8, the counter value of the counter 3 also reaches the overflow value within the specific duration, and the overflow signal ov (H) of "H (1)" is output from the comparator 4.

The overflow signal ov (H) from the comparator 4 is inverted in the NOT circuit SUB 4 to "L (0)", and "L (0)" is input to the respective data input terminals of each of the flip-flops DFF3 to DFF0.

Then, in this state, the trimming setting value is shifted for the counter operation duration of the counter 3 of the specific duration at the next time of regulation, with the trimming setting value li_trm1 changed to "L (0)" and the trimming setting value li_trm0 changed to "H (1)".

When the trimming setting value li_trm1 and the trimming setting value li_trm0 are changed in this manner, the flip-flop DFF1 and the flip-flop DFF0 are latched to the output "L (0)" from the NOT circuit SUB 4 that is being input to their data input terminals, and "L (0)" is output to the OR circuit SUB 1 and the OR circuit SUB 0.

The output of the OR circuit SUB 2 is accordingly made "L (0)", and the output of the OR circuit SUB 0 that is being input to one input with the trimming setting value li_trm0 of "H (1)" is made "H (1)", and the trimming circuit 1 is input with "0001" as the trimming value.

As a result, the CR oscillation circuit 2 oscillates at a frequency intermediate between those corresponding to trimming value "0000" and the trimming value "0010", namely a frequency corresponding to the trimming value "0001".

Thus operation based on the trimming setting values li_trm3 to li_trm0 from the external device regulates the oscillation frequency of the CR oscillation circuit 2 to the optimum value by repeating the trimming bits worth of times, 4-bits worth of times in the examples of FIG. 7 to FIG. 9.

Note that whereas regulation is ended in a state in which the CR oscillation circuit 2 is oscillating at the frequency due to trimming value "0001" and the overflow signal ov is not being output from the comparator 4 in the example of FIG. 8, regulation may be ended in a state in which the overflow signal ov is being output from the comparator 4.

The related oscillation frequency regulating circuit thus determines the trimming value by operating a constant time counter using an oscillation source clock and performing overflow determination.

However, in the related oscillation frequency regulating circuit, the overflow value is a fixed value, and therefore the count duration also needs to be fixed, with an issue arising that this means that regulation and testing takes time.

Namely, when oscillation frequency regulation operation is executed, since the overflow value of the counter is fixed, there is a need to operate the counter for the predetermined fixed duration. There is also a need to operate the counter for the trimming bits worth of times, with an issue arising of an increase in the trimming duration. For example, when executing a counter at 8-bit precision for 100µ seconds oscillation frequency regulation operation, the regulation and test time is "100µ seconds×8=800µ seconds", with the regulation and test duration increasing as the precision of trimming is raised.

SUMMARY

The present invention is directed to addressing the above issues, and an object thereof is to provide an oscillation frequency regulating circuit, a semiconductor device, an electronic device, and an oscillation frequency regulation method capable of performing high precision oscillation frequency regulation quickly.

A first aspect of the present invention provides an oscillation frequency regulating circuit including:

a measuring section that performs measurement based on an oscillation frequency of an oscillation circuit;

a comparator section that compares a measurement value measured by the measuring section against a set comparison value over a set comparison duration;

a setting section that sets a comparison value selected from a plurality of comparison values of different magnitudes and that sets in the comparator section the comparison duration according to the magnitude of the selected comparison value; and a regulation section that, based on the comparison result of the comparator section, regulates the oscillation frequency of the oscillation circuit such that the oscillation frequency that is measured by the measuring section becomes a target oscillation frequency.

Here, the setting section may sets a first comparison value of a small value and a first comparison duration of a short length until a number of times of regulation of the oscillation frequency by the regulation section equals a specific number of times; and sets a second comparison value greater than the first comparison value and a second comparison duration longer than the first comparison duration when the number of times of regulation has exceeded the specific number of times.

A second aspect of the present invention provides a semiconductor device including:

the oscillation frequency regulating circuit and the oscillation circuit of the first aspect; and a central processor that performs operation control of the oscillation frequency regulating circuit and the oscillation circuit.

A third aspect of the present invention provides an electronic device including:

the semiconductor device of the second aspect; and a sensor.

A fourth aspect of the present invention provides a method of regulating an oscillation frequency including: measuring an oscillation frequency of an oscillation circuit;

selecting a single comparison value from a plurality of comparison values of different magnitudes and setting a comparison duration according to the magnitude of the selected comparison value;

comparing the oscillation frequency measured by the measuring with the comparison value set by the setting over the comparison duration set by the setting; and regulating the oscillation frequency of the oscillation circuit such that the oscillation frequency measured by the measuring becomes a target oscillation frequency.

According to the present invention, the comparison value (overflow value) and the comparison duration (counter operation duration) can be set by selecting from plural respective values. For example, high precision regulation can be performed over a long duration for portions requiring high precision, and regulation can be completed quickly in a short time for portions for which lower precision is acceptable. It is thus possible to maintain required precision while shortening the overall regulation duration.

BRIEF DESCRIPTION OF THE DRAWINGS

Exemplary embodiments of the present invention will be described in detail based on the following figures, wherein.

DETAILED DESCRIPTION

Explanation follows regarding an exemplary embodiment of the present invention, with reference to the drawings.

Figure 1:
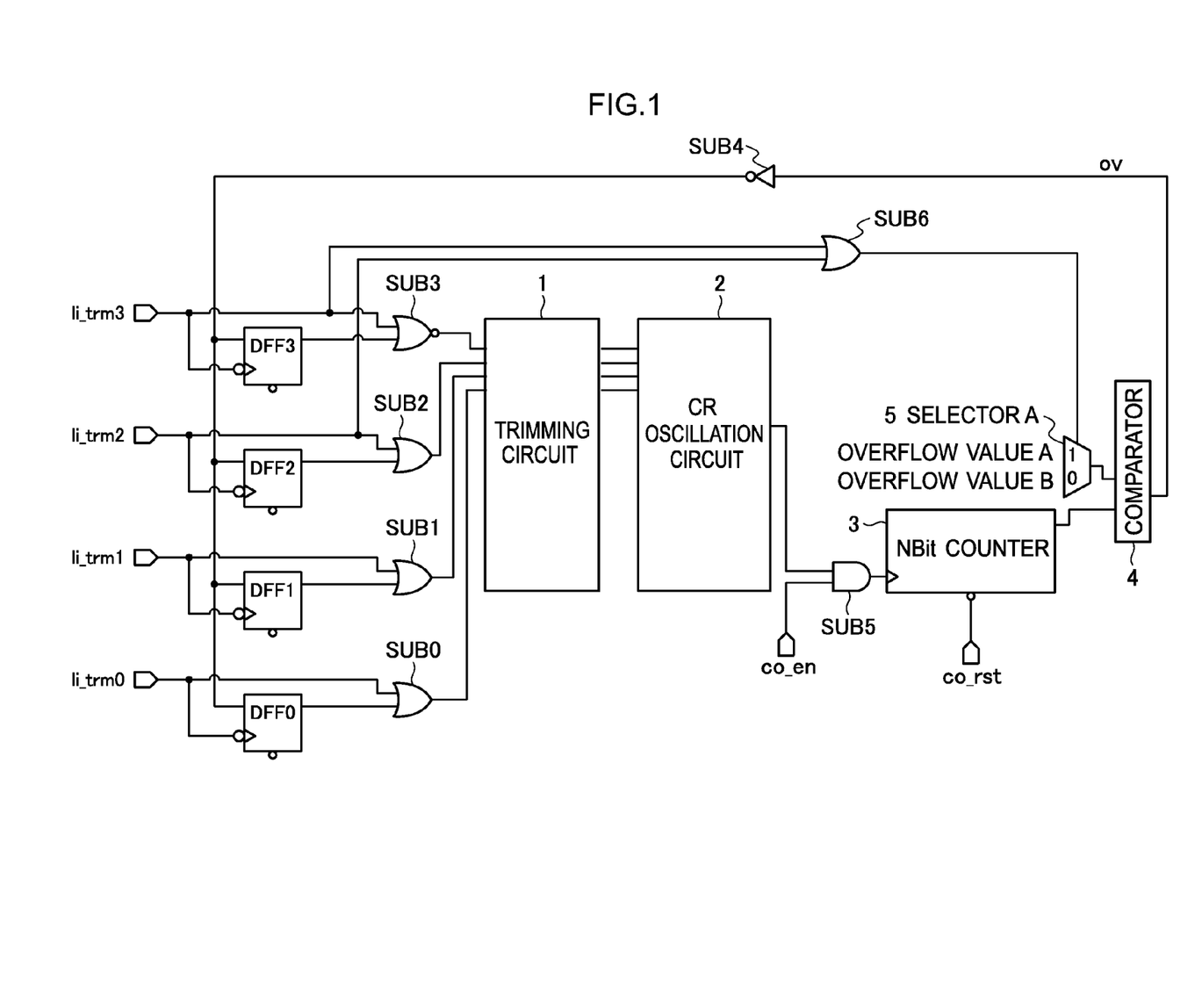
FIG. 1 is a circuit diagram illustrating an example of a configuration of an oscillation frequency regulating circuit according to an exemplary embodiment.

FIG. 1 illustrates a configuration of an oscillation frequency regulating circuit according to the present exemplary embodiment, configured by providing a setting section according to the present invention configured by a selector A5 and a OR circuit SUB 6 to the related oscillation frequency regulating circuit illustrated in FIG. 7. Moreover, while not shown in the drawings, an external device such as a tester employed during oscillation frequency regulation is also connected in this configuration.

As illustrated in FIG. 1, the configuration and operation of the circuit portions for generating a trimming signal in the oscillation frequency regulating circuit according to the present exemplary embodiment (a trimming circuit 1, a counter 3, a comparator 4, flip-flops DFF3 to DFF0, a NOR circuit SUB 3, OR circuits SUB 2 to SUB 0, an AND circuit SUB 5 and a NOT circuit SUB 4) are substantially the same as those of the related circuit explained with reference to FIG. 7 to FIG. 9. However, operation differs due to provision of the selector A5 and the OR circuit SUB 6, and corresponding to this operation there is accordingly also a difference in operation to change a counter operation duration setting signal co_en using an external device to set the counter operation duration of the counter 3.

Note that a regulation section according to the present invention includes the trimming circuit 1, the flip-flops DFF3 to DFF0, the NOR circuit SUB 3, the OR circuits SUB 2 to SUB 0 and the NOT circuit SUB 4, a setting section according to the present invention includes the selector A5 and the OR circuit SUB 6, the external device (the counter operation duration setting signal co_en) and the AND circuit SUB 5, and a comparator section according to the present invention is configured by the comparator 4.

First explanation follows regarding basic operation. In the oscillation frequency regulating circuit, the counter 3 is operated by the clock of the CR oscillation circuit 2 for a fixed counting operation duration by setting the counter operation duration setting signal co_en. Overflow determination is then performed in the comparator 4 based on comparison of count result data of the counter 3 against one or other of the overflow values A or B selected by the selector A5. A trimming value used for regulating the oscillation frequency of the CR oscillation circuit 2 is then determined based on this overflow determination result.

In FIG. 1, a 4-bit trimming setting value configured from li_trm3, li_trm2, li_trm1 and li_trm0 that are input from an external device such as a tester connected during oscillation frequency regulation are respectively input to the clocks of each of the flip-flops DFF3 to DFF0, and respectively input as one input of the NOR circuit SUB 3, the OR circuit SUB 2, the OR circuit SUB 1, or the OR circuit SUB 0.

Note that the highest order bit trimming setting value is the li_trm3 and the lowest order bit trimming setting value is the li_trm0, and for each time of regulation operation a bit value 1 is input in sequence from an external device so as to shift from the higher order bits towards lower order bits one bit at a time.

The respective outputs of each of the flip-flops DFF3 to DFF0 are input to the other inputs of the NOR circuit SUB 3 and the OR circuits SUB 2 to SUB 0.

The output from each of the NOR circuit SUB 3 and the OR circuits SUB 2 to SUB 0 are then input as data inputs to the trimming circuit 1.

The counter operation duration setting signal co_en from the external device is input as one of the inputs of the AND circuit SUB 5, and the output of the CR oscillation circuit 2 is input as the other input to the AND circuit SUB 5.

The output of the AND circuit SUB 5 is input as a clock input to the counter 3, and a co_rst signal is input as a reset signal to the counter 3.

The output of the counter 3 is then input as one of the inputs of the comparator 4, and the output of the comparator 4 is input to the NOT circuit SUB 4. The output of the NOT circuit SUB 4 is respectively input as data input to each of the flip-flops DFF3 to DFF0.

In the present exemplary embodiment two values of the overflow values A, B are set and stored for example in a register, not shown in the drawings, as overflow values for employing in comparison against the output (counter value) of the counter 3 that is input to one of the inputs of the comparator 4. A selector A5 selects one or other of the overflow values A, B based on the li_trm3 and the li_trm2 set by the external device and input through the OR circuit SUB 6, and inputs the selection to the comparator 4.

In the present exemplary embodiment, the selector A5 selects the overflow value A when either the li_trm3 and/or the li_trm2 is "1" and the output of the OR circuit SUB 6 is "1". Here, it is assumed that the overflow value A is a smaller value than the overflow value B. Note that the counter operation duration of the counter 3 is set shorter when the overflow value A has been selected than when the overflow value B has been selected.

Thus when the counter 3 is measuring the oscillation frequency of the CR oscillation circuit 2 over a shorter operation duration, the comparator 4 performs a comparison with the smaller value of the overflow value A, and when the counter 3 is measuring the oscillation frequency of the CR oscillation circuit 2 over a longer operation duration the comparator 4 performs a comparison with the larger value of the overflow value B. In each case comparison is accordingly performed against the target oscillation frequency.

In the present exemplary embodiment, in order to reduce the regulation duration, the li_trm3 is "1" at the regulation start time, then the li_trm2 is set to "1" at the next time of regulation, and the comparator 4 performs a comparison of the output value of the counter 3 for a short operation time against the small value overflow value A until a specific regulation number of times is reached from the regulation start time. Namely, the external device sets the li_trm3 to "1", and also changes the counter operation duration setting signal co_en to a short value. Accordingly, the counter operation duration of the counter 3 when the small value overflow value A is being selected by the selector A5 is a shorter counter operation duration than when the overflow value B is being selected by the selector A5.

Figure 2:
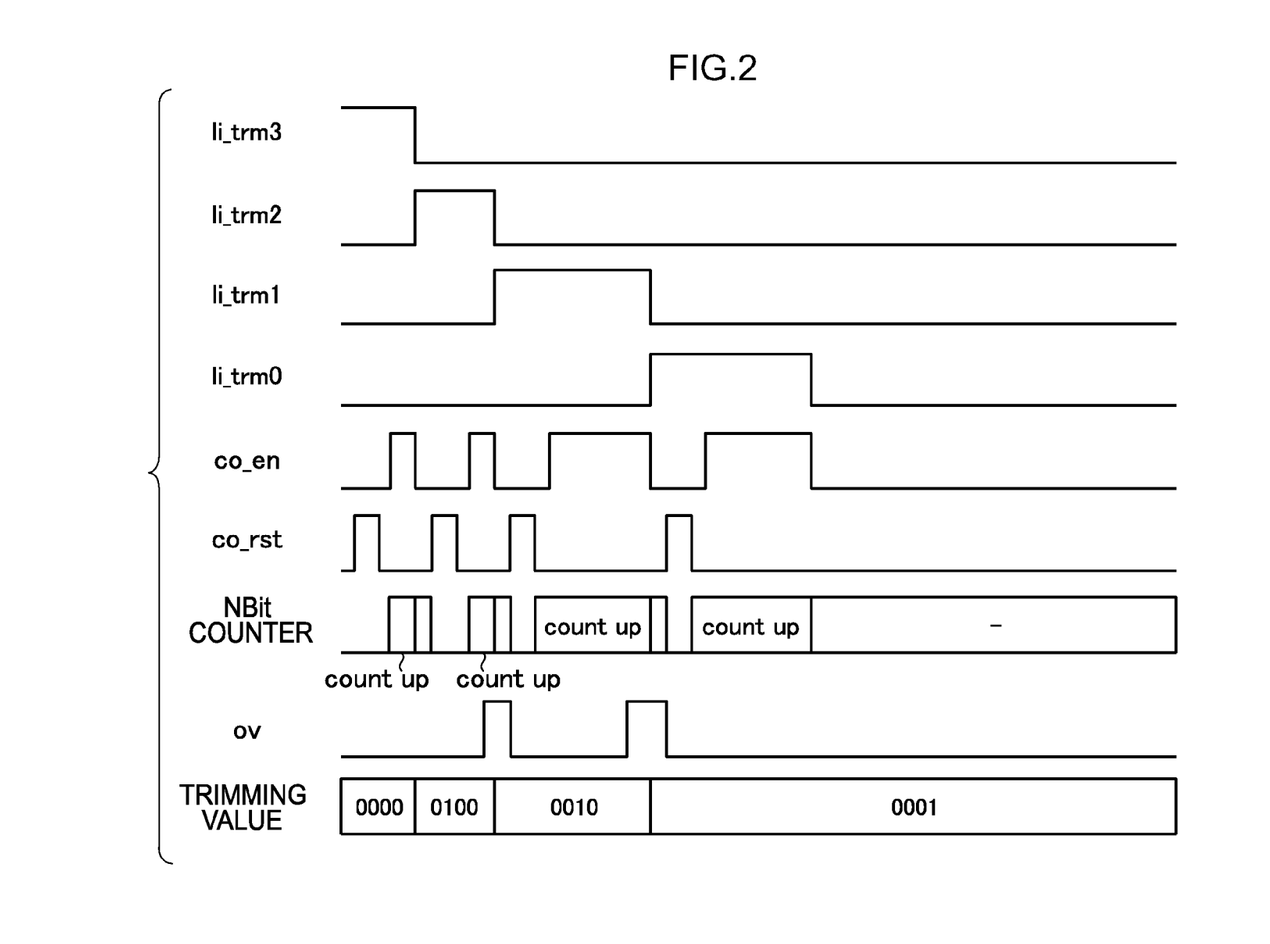
FIG. 2 is a timing chart illustrating an example of operation of the oscillation frequency regulating circuit of FIG. 1.

Explanation follows regarding automatic trimming operation of the oscillation frequency regulating circuit configured as described above, with reference to the timing chart illustrated in FIG. 2.

Note that the relationship between the trimming value and the oscillation frequency is, as illustrated in FIG. 9 and described above, such that the oscillation frequency becomes the highest (fastest) when the value input to the trimming circuit 1 corresponding to the highest order bit trimming setting value li_trm3 is "0" and the values input to the trimming circuit 1 corresponding to each of the following bit trimming setting values li_trm2 to li_trm0 are "1" ("0111"), such that the oscillation frequency becomes the lowest (slowest) when the value input to the trimming circuit 1 corresponding to the highest order bit trimming setting value li_trm3 is "1" and the values input to the trimming circuit 1 corresponding to each of the following bit trimming setting values li_trm2 to li_trm0 are "0" ("1000"), and such that the oscillation frequency is an intermediate frequency when the trimming setting values li_trm3 to li_trm0 are all "0".

In FIG. 1, first the trimming setting value li_trm3 from the external device is input as "H", namely "1" and the trimming setting values li_trm2 to li_trm0 are input from the external device as "L", namely "0", such that "0000" is input as the trimming value to the trimming circuit 1 by the flip-flops DFF3 to DFF0, the NOR circuit SUB 3 and the OR circuits SUB 2 to SUB 0.

This state is the initial state after each of the flip-flops DFF3 to DFF0 have been reset from the external device. When, without operating each of the flip-flops DFF3 to DFF0, the trimming setting value li_trm3 "H (1)" and the trimming setting values li_trm2 to li_trm0 "L (0)" are input respectively to the NOR circuit SUB 3 and the OR circuits SUB 2 to SUB 0, the trimming setting value li_trm3 "H (1)" is inverted by the NOR circuit SUB 3 to "L (0)", and as a result the intermediate trimming value "0000" is input to the trimming circuit 1.

Based on the input trimming value the trimming circuit 1 generates a control signal to be employed in regulating circuit elements such as resistors and capacitors in the CR oscillation circuit 2 used for setting the oscillation frequency, and outputs the control signal to the CR oscillation circuit 2. The CR oscillation circuit 2 accordingly oscillates with the intermediate frequency corresponding to the trimming value "0000".

In this state, the counter 3 is operated for a predetermined counter operation duration by the external device with the counter operation duration setting signal co_en at "H (1)", and the oscillation frequency of the CR oscillation circuit 2 is counted (measured) in the counter 3.

The counter values of the counter 3 are sequentially input to the comparator 4, and the comparator 4 compares the counter values of the counter 3 against the overflow value A selected by the selector A5. When the "counter value>overflow value" occurs during the counter operation duration, the comparator 4 outputs "H (1)" as the overflow signal ov. Note that the output of the comparator 4 remains at "L (0)" when "counter value>overflow value" does not occur during the counter operation duration.

Thus when the specific counter operation duration elapses, the counter operation duration setting signal co_en from the external device becomes "L (0)", and the counter operation of the counter 3 is stopped.

In FIG. 2, the time when the counter operation duration setting signal co_en from the external device becomes "L (0)" and counter operation of the counter 3 is stopped is shorter than the counter operation duration at the operation time with the trimming value "0000" illustrated in FIG. 7. The oscillation frequency regulation duration can accordingly be shortened.

Note that in FIG. 2, the counter value of the counter 3 does not reach the overflow value during the specific counter operation duration when the trimming value "0000" is input, and the overflow signal ov output from the comparator 4 is "L (0)".

This output is inverted by the NOT circuit SUB 4 to "H (1)", and input respectively to the flip-flops DFF3 to DFF0 to latch the flip-flops DFF3 to DFF0 to "H (1)".

In this state, when counter operation of the counter 3 takes place at the next time of regulation for the specific duration, the trimming setting value from the external device is shifted from the higher order bit such that the trimming setting value li_trm3 is changed to "L (0)" and the trimming setting value li_trm2 is changed to "H (1)".

Note that the trimming setting value li_trm2 is "H (1)" even though the trimming setting value li_trm3 is changed to "L (0)", and the selector A5 continues to select the overflow value A. The setting of the counter operation duration setting signal co_en from the external device accordingly remains set at the short counter operation duration.

On the other hand, when the trimming setting value li_trm3 and the trimming setting value li_trm2 are changed, the flip-flop DFF3 and the flip-flop DFF2 output to the NOR circuit SUB 3 and the OR circuit SUB 2 the output "H (1)" from the NOT circuit SUB 4 that is being input to their data input terminals.

The output of the NOR circuit SUB 3 accordingly becomes "L (0)", and the output of the OR circuit SUB 2 becomes "H (1)", and "0100" is input as a trimming value to the trimming circuit 1. As a result the CR oscillation circuit 2 oscillates with an intermediate frequency between those corresponding to the trimming value "0000" and the trimming value "0111".

Namely, since the counter value of the counter 3 does not reach the overflow value with oscillation at the intermediate oscillation frequency corresponding to the trimming value "0000", the CR oscillation circuit 2 is caused to oscillate faster (higher) than oscillation with the intermediate oscillation frequency corresponding to the trimming value "0000", and at an intermediate oscillation frequency between those corresponding to trimming value "0000" and the trimming value "0111".

At this trimming value setting ("0100"), as illustrated in FIG. 2, the counter value of the counter 3 reaches the overflow value within the specific duration, and the overflow signal ov "H (1)" is output from the comparator 4.

The overflow signal ov (H) from the comparator 4 is inverted by the NOT circuit SUB 4 to "L (0)" and then input to each of the flip-flops DFF3 to DFF0 so as to latch the flip-flops DFF3 to DFF0 to "L (0)".

Similarly, in this state, in the counter operation duration of the counter 3 for the specific duration at the next time of regulation, the trimming setting value from the external device is shifted, and the trimming setting value li_trm2 is changed to "L (0)" and the trimming setting value li_trm1 is changed to "H (1)".

Note that when the trimming setting value li_trm2 and the trimming setting value li_trm1 are changed in this manner both the trimming setting value li_trm3 and the trimming setting value li_trm2 become "L (0)", and so the selector A5 selects the large value overflow value B rather than the small value overflow value A. Moreover the setting of the counter operation duration setting signal co_en from the external device is changed and set to a long counter operation duration.

When the trimming setting value li_trm2 and the trimming setting value li_trm1 are changed in this manner, the flip-flop DFF2 and the flip-flop DFF1 output to the OR circuit SUB 2 and the OR circuit SUB 1 the output "L (0)" from the NOT circuit SUB 4 that is being input to their data input terminals.

The output of the OR circuit SUB 2 thus becomes "L (0)", and the trimming setting value li_trm1 of "H (1)" is input to one of the inputs of the OR circuit SUB 1, and the output of the OR circuit SUB 1 becomes "H (1)". The trimming circuit 1 is accordingly input with "0010" as the trimming value.

As a result the CR oscillation circuit 2 oscillates this time at an intermediate oscillation frequency between those corresponding to the trimming value "0000" and the trimming value "0100".

Namely, when oscillation is at the frequency corresponding to the trimming value "0100", the counter value of the counter 3 reaches the overflow value within the counter operation duration even though the counter operation duration is short. The CR oscillation circuit 2 is accordingly caused to oscillate at an intermediate oscillation frequency slower (lower) than oscillation at the intermediate oscillation frequency corresponding to trimming value "0000", and at an intermediate oscillation frequency between those corresponding to the trimming value "0000" and the trimming value "0100".

Also in this trimming value setting ("0010"), as illustrated in FIG. 2, the counter value of the counter 3 reaches the overflow value within the longer counter operation duration, and the overflow signal ov (H) of "H (1)" is output from the comparator 4.

The overflow signal ov (H) from the comparator 4 is inverted in the NOT circuit SUB 4 to "L (0)" and then input respectively to the flip-flops DFF3 to DFF0 so as to latch the flip-flops DFF3 to DFF0 to "L (0)".

Then in this state, the trimming setting value is shifted in the counter operation duration of the counter 3 for the longer counter operation duration at the next time of regulation, and the trimming setting value li_trm1 is changed to "L (0)", and the li_trm0 is changed to "H (1)".

When the trimming setting value li_trm1 and the trimming setting value li_trm0 are changed in this manner, the overflow value B is selected by the selector A5, and the counter operation duration setting signal co_en from the external device is controlled to set to the longer counter operation duration.

When the trimming setting value li_trm1 and the trimming setting value li_trm0 have changed in this manner, the flip-flop DFF1 and the flip-flop DFF0 output to the OR circuit SUB 1 and the OR circuit SUB 0 the output "L (0)" from the NOT circuit SUB 4 that is being input to their data input terminals.

The output of the OR circuit SUB 2 thus becomes "L (0)", and the output of the OR circuit SUB 0 that has one input terminal that is being input with the trimming setting value li_trm0 of "H (1)" becomes "H (1)", and "0001" is input as the trimming value to the trimming circuit 1.

As a result, the CR oscillation circuit 2 is caused to oscillate at a frequency between those corresponding to the trimming value "0000" and the trimming value "0010", at the oscillation frequency corresponding to the trimming value "0001".

Thus operation according to the trimming setting values li_trm3 to li_trm0 from the external device is repeated the trimming bits worth of times, 4-bits worth of times in the examples of FIG. 1 and FIG. 2, and the oscillation frequency of the CR oscillation circuit 2 is regulated to the optimum value.

Note that in the example illustrated in FIG. 2, when the CR oscillation circuit 2 is oscillating at the frequency corresponding to the trimming value "0001" regulation is ended in a state in which the overflow signal ov is not being output from the comparator 4, however regulation may end in a state in which the overflow signal ov is being output from the comparator 4.

Thus in the oscillation frequency regulating circuit configured as illustrated in FIG. 1, based on the higher order bit of the trimming setting value input from the external device, an overflow value to be employed in comparison against the counter value of the counter 3 can be changed and the counter operation duration of the counter 3 can be changed, such that for example the oscillation frequency regulation duration can be shortened by shortening the counter operation duration of the counter 3.

Figure 3:
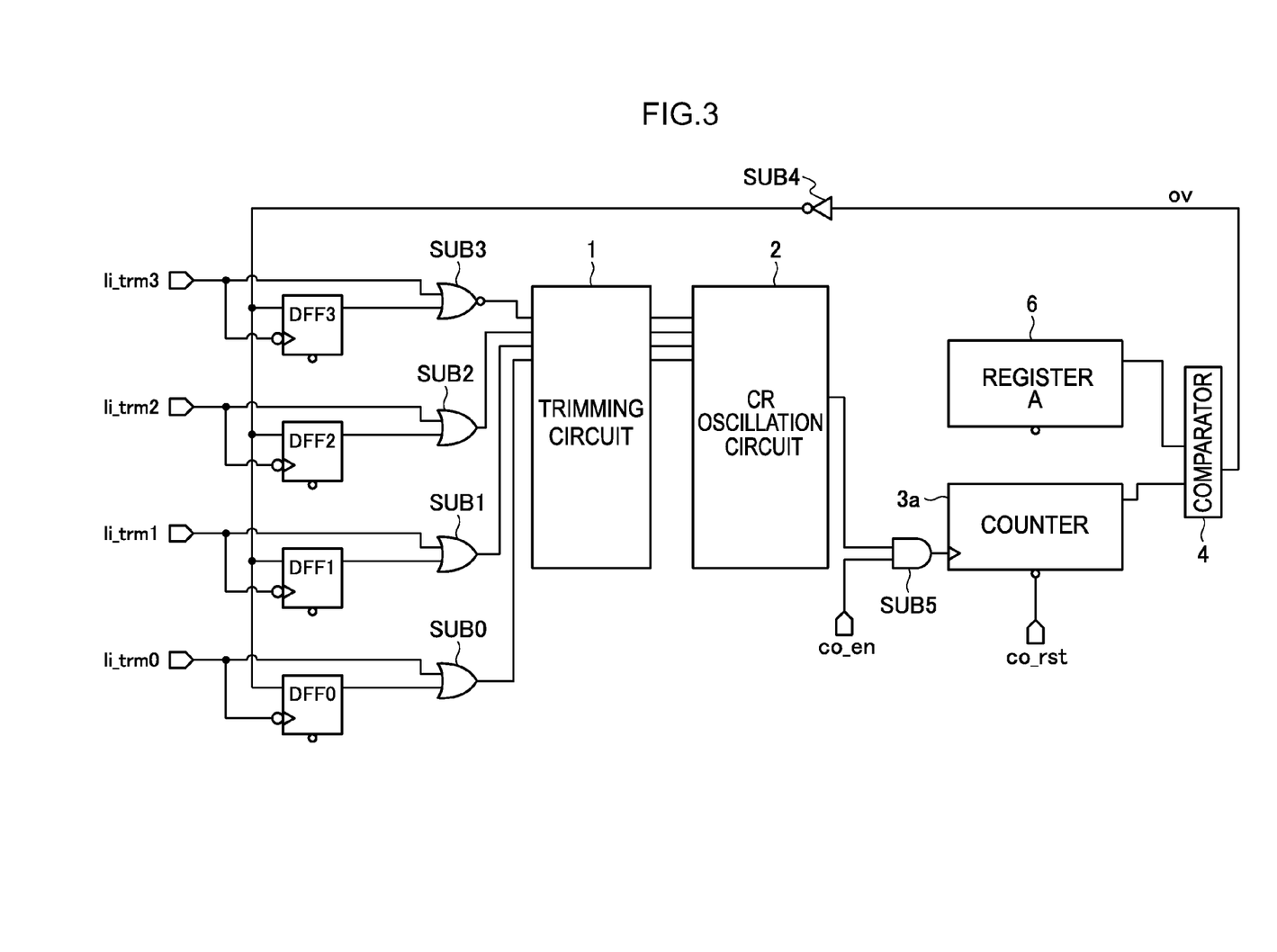
FIG. 3 is a circuit diagram illustrating an example of a configuration of another oscillation frequency regulating circuit according to an exemplary embodiment.
Figure 4:
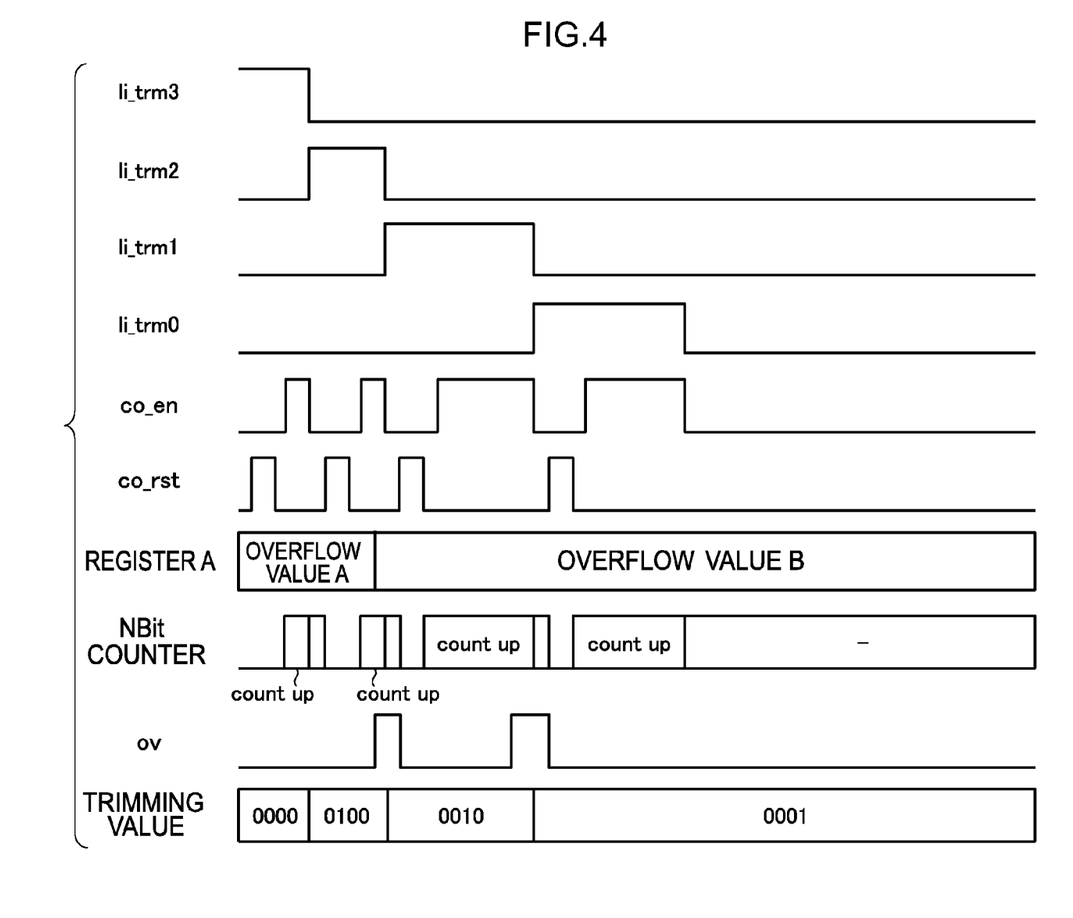
FIG. 4 is a timing chart illustrating an example of operation of the oscillation frequency regulating circuit of FIG. 3.

Explanation next follows regarding another exemplary embodiment of an oscillation frequency regulating circuit, with reference to FIG. 3 and FIG. 4.

The oscillation frequency regulating circuit illustrated in FIG. 3 differs from the oscillation frequency regulating circuit illustrated in FIG. 1 and the related oscillation frequency regulating circuit illustrated in FIG. 7 in that a register A6 is provided in the oscillation frequency regulating circuit of FIG. 3, to serve as the setting section according to the present invention for setting an overflow value employed in a comparator 4.

Namely, in the oscillation frequency regulating circuit of FIG. 3, overflow values A, B such as for example as illustrated FIG. 1 are set in the register A6 by an external device such as a tester connected when oscillation frequency regulation is performed. A counter operation duration setting signal co_en from an external device is controlled according to an overflow value setting, and a counter operation duration of the counter 3 is changed. In this case, at a regulation start time a trimming setting value li_trm3 is set at "1" by the external device, and the overflow value A is selected.

Other parts of the operation are similar to those illustrated in FIG. 1, FIG. 2, FIG. 7 and FIG. 8, and further detailed explanation is omitted. For example, in contrast to FIG. 2, the overflow values A, B of FIG. 1 are set in the register A6, as illustrated in FIG. 4. Further, in such cases the operation of the comparator based on the set overflow value A, B is similar to that illustrated in FIG. 1 and FIG. 2.

As above, in the oscillation frequency regulating circuit configured as illustrated in FIG. 3, when an overflow value input from the external device is set in the register A6, a small value overflow value A is set during the initial times of regulation and then, partway through operation, the overflow value is changed to a large value overflow value B. In coordination therewith, the counter operation duration setting signal co_en is controlled by an external device such that the counter operation duration of the counter 3 is short in the initial period and is then lengthened partway through operation. Thus the oscillation frequency regulation duration can be shortened, similarly to in the oscillation frequency regulating circuit configured as illustrated in FIG. 1.

Note that a regulation section according to the present invention is configured including a trimming circuit 1, flip-flops DFF3 to DFF0, a NOR circuit SUB 3, OR circuits SUB 2 to SUB 0, and a NOT circuit SUB 4 of FIG. 3, and a setting section according to the present invention is configured including an external device, the register A6 and a AND circuit SUB 5.

Figure 5:
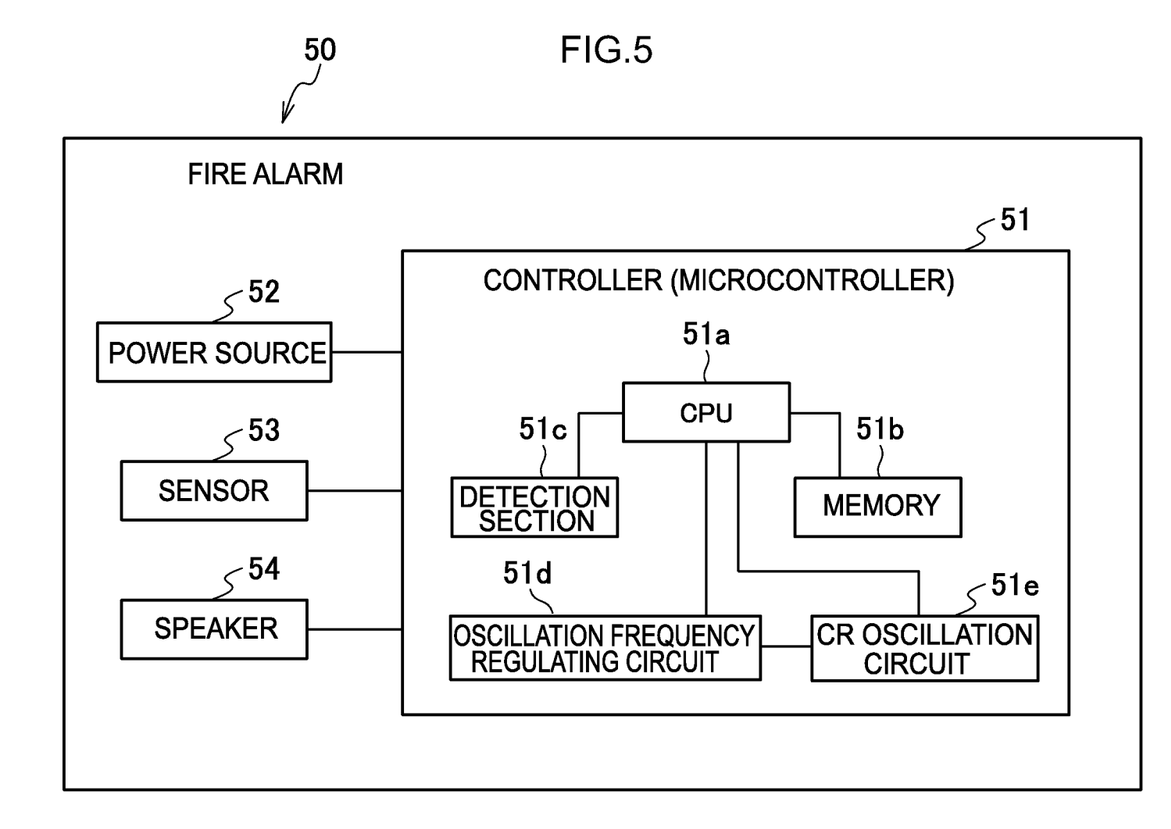
FIG. 5 is a block diagram illustrating an example of a configuration of a semiconductor device and an electronic device according to an exemplary embodiment.

A semiconductor device employing the oscillation frequency regulating circuit illustrated in FIG. 1 or FIG. 3 and an electronic device provided with such a semiconductor device are illustrated in FIG. 5. Explanation follows regarding the semiconductor device and the electronic device illustrated in FIG. 5.

In FIG. 5, a configuration of a fire alarm 50 serving as an electronic device is illustrated. A controller (microcontroller) 51 that performs overall operation control of the fire alarm 50 is integrally configured as a semiconductor device. A power source 52, a sensor 53 and a speaker 54 are connected to the controller (microcontroller) 51. The controller (microcontroller) 51, the sensor 53 and the speaker 54 are operated by power from the power source 52. When a detection signal is input to the controller (microcontroller) 51 by the sensor 53, the controller (microcontroller) 51 causes audio information representing the detection result of the sensor 53 to be output from the speaker 54.

The controller (microcontroller) 51 is provided with a Central Processing Unit (CPU) 51a, a memory 51b, a detection section 51c and with an oscillation frequency regulating circuit 51d and a CR oscillation circuit 51e as illustrated in FIG. 1 or FIG. 3. The operation of the detection section 51c, the oscillation frequency regulating circuit 51d and the CR oscillation circuit 51e is controlled according to computer processing of the CPU 51a based on a program stored in the memory 51b.

For example, when the fire alarm 50 is manufactured or set, under control of the CPU 51a the oscillation frequency regulating circuit 51d is input with the above trimming setting values li_trm3 to li_trm0 from an external device and the counter operation duration setting signal co_en is input. The oscillation speed (oscillation frequency) of the CR oscillation circuit 51e is regulated according to these input values, and after completing regulation the CPU 51a controls operation of the detection section 51c based on the oscillation signal from the CR oscillation circuit 51c.

The detection section 51c detects a fire occurring based on the input signal from the sensor 53, and, based on the detection result from the detection section 51c, the CPU 51 warns that a fire has occurred through the speaker 54.

In the oscillation frequency regulating circuit 51d of the present exemplary embodiment, the regulation duration of the CR oscillation circuit 51e can be shortened, and so regulation of the CR oscillation circuit 51e can be performed not only at factory shipping but also on other occasions, such as when power is introduced to the fire alarm 50, enabling further raising of the precision of the fire alarm 50. As a result, use is expected in environments that traditionally cause problems, such as environments with harsh changes in temperature.

Figure 6:
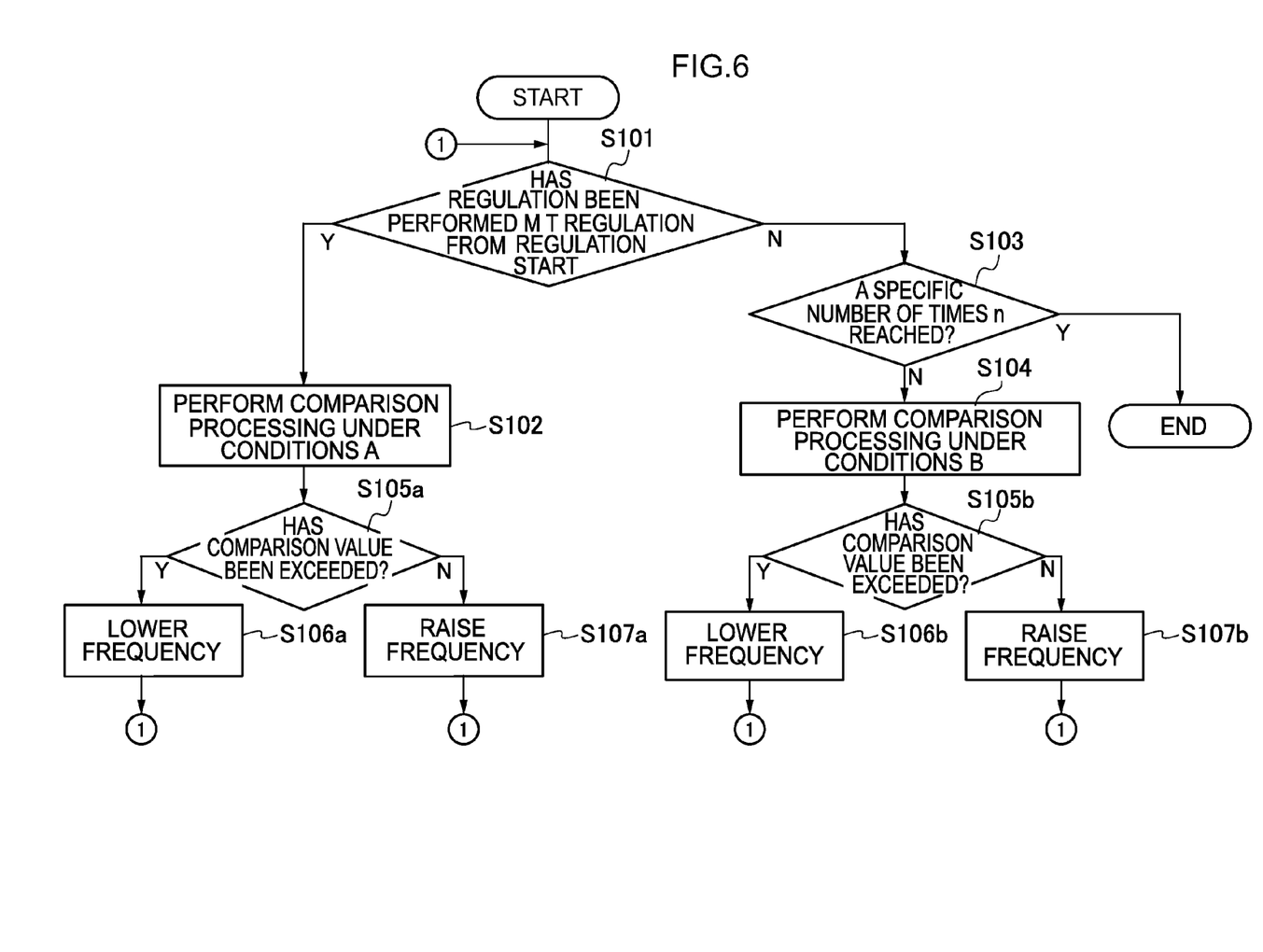
FIG. 6 is a flow chart illustrating an example of a sequence in an oscillation frequency regulation method of an oscillation frequency regulating circuit according to an exemplary embodiment.

Explanation next follows regarding processing operation of an oscillation frequency regulating circuit of the present exemplary embodiment, with reference to FIG. 6. Note that the processing operation of the oscillation frequency regulating circuit basically includes: measuring to measure an oscillation frequency of an oscillation circuit; setting to select a single comparison value from plural comparison values of different magnitudes and to set a comparison duration corresponding to the magnitude of the selected comparison value; comparing to compare the oscillation frequency measured by the measuring against the comparison value set by the setting for the comparison duration set in the setting; and regulating based on the comparison result of the comparing to regulate the oscillation frequency of the oscillation circuit such that the measured oscillation frequency of the measuring becomes a target oscillation frequency.

Explanation follows regarding, in the setting, setting in which a first comparison value of smaller value and a first comparison duration of a shorter length are set until the number of times of regulating the oscillation frequency by the regulating reaches a specific number of times, and setting in which a second comparison value that is larger than the first comparison value and a second comparison duration that is longer than the first comparison duration are set when the number of times of regulating has exceeded the specific number of times.

When comparison is being performed from initial regulation until the predetermined regulation number of times m (step S101), the small comparison value is compared with the oscillation frequency of the oscillation circuit (the counter value of the counter 3), and this is performed for a short determined duration associated with this comparison value. Namely, comparison is performed under conditions A (step S102).

When comparison is being performed from the predetermined regulation number of times m onwards, determination is made as to whether or not the number of times of comparison has reached a specific number of times n (n>m) (step S103). Until the specific number of times n is reached, comparison is performed between the large comparison value and the oscillation frequency of the oscillation circuit (the counter value of the counter 3) for a long determined duration associated with this comparison value (step 104). Namely comparison is performed under conditions B (step S104).

As a result of comparison, when the oscillation circuit oscillation frequency (the counter value of the counter 3) has exceeded the comparison value (step S105a, 105b), the oscillation frequency of the oscillation circuit is regulated lower so as to achieve the target oscillation frequency (step S106a, S106b). When the result of comparison is that the oscillation circuit oscillation frequency (the counter value of the counter 3) has not exceeded the comparison value, the oscillation frequency of the oscillation circuit is regulated higher so as to achieve the target oscillation frequency (step 107a, S107b), and then regulation is repeated.

Note that processing is ended when the number of times of comparison has reached the specific number of times n at the determination of step S103.

As explained with reference to FIG. 1 to FIG. 6, the oscillation frequency regulating circuit of the present exemplary embodiment is configured including: the counter 3 that performs measuring based on the oscillation frequency of the CR oscillation circuit 2; the comparator 4 that compares the measured value of the oscillation frequency measured by the counter 3 against the set comparison value during the set comparison duration; a setting section (external device) that sets the comparison duration in the comparator 4 to correspond to the comparison value selected from plural comparison values of different magnitudes and the magnitude of the selected comparison value; and a regulation section (configured including the trimming circuit 1, the flip-flops DFF3 to DFF0, the NOR circuit SUB 3, the OR circuits SUB 2 to SUB 0, and the NOT circuit SUB 4) that based on the comparison result of the comparator 4 regulates the oscillation frequency of the CR oscillation circuit 2 such that the oscillation frequency measured by the counter 3 becomes the target oscillation frequency. Until the number of times of regulating the oscillation frequency has become a specific number of times of regulation, regulation is performed with the comparison value set to a small value and the comparison duration set to a short length. On the other hand, when the number of times of regulation has exceeded the specific number of times, regulation is performed with the comparison value set to a larger value and the comparison duration set to a longer length.

Note that in the regulation section, the oscillation frequency of the CR oscillation circuit 2 is made to oscillate at an intermediate regulation frequency between a maximum regulation frequency and a minimum regulation frequency. When the comparison result indicates that the measured oscillation frequency is less than the set comparison value, regulation is performed at a regulation frequency between the maximum regulation frequency and the minimum regulation frequency to gradually bring oscillation at the regulation frequency nearer to the target oscillation frequency each time regulation is performed. However, when the comparison result indicates that the measured oscillation frequency is the set comparison value or greater, regulation is performed at a regulation frequency between the minimum regulation frequency and the intermediate regulation frequency to gradually bring oscillation at the regulation frequency nearer to the target oscillation frequency each time regulation is performed.

The regulation section employs a trimming regulation signal configured by a bit sequence of m-bits to regulate the oscillation frequency of the CR oscillation circuit 2, and repeatedly performs regulation m times employing $2^m$ individual values of the trimming regulation signal. Here, m is an integer that is equal to or greater than 2.

Moreover, the setting section sets a comparison value for the comparator 4 and a comparison duration for the counter 3 based on predetermined higher order plural bits of the m-bit input signal input from an external device that is shifted in sequence one bit at a time from the high order bits towards the low order bits each time of regulation.

Accordingly, it is possible to perform high precision oscillation frequency regulation quickly due to performing regulation with a short duration employing a small comparison value for a predetermined duration from the start of regulation.

A controller (microcontroller) serving as a semiconductor device of the present exemplary embodiment is provided for example to an electronic device such as a fire alarm equipped with such an oscillation frequency regulating circuit and oscillation circuit, and with a CPU that performs operation control of the oscillation frequency regulating circuit and the oscillation circuit.

Note that although examples of the present invention have been explained by reference to FIG. 1 to FIG. 6 there is no limitation thereto and various changes are possible without departing from the spirit of the invention. For example, although in the present exemplary embodiment configuration was based on a 4-bit trimming signal, application may be made to an oscillation frequency regulating circuit that performs trimming control at higher precision, such as with 8-bits.

The overflow value and the counter operation duration are each set with two values in the present exemplary embodiment, however configuration may be made such that 3 or more different respective values are set therefor.

With respect to the configuration of the regulation section too, although configuration in the present exemplary embodiment is made with the trimming circuit 1, the flip-flops DFF3 to DFF0, the NOR circuit SUB 3, the OR circuits SUB 2 to SUB 0 and the NOT circuit SUB 4 there is no limitation thereto and appropriate changes may be made.

Moreover, the controller (microcontroller) serving as the semiconductor device equipped with such an oscillation frequency regulating circuit may be provided to an electronic device other than a fire alarm, such as for example a mobile phone.

What is claimed is:

1. An oscillation frequency regulating circuit comprising:
   a measuring section that performs measurement based on an oscillation frequency of an oscillation circuit;
   a comparator section that compares a measurement value measured by the measuring section against a set comparison value over a set comparison duration;
   a setting section that sets a comparison value selected from a plurality of comparison values of different magnitudes responsive to higher order bits of a multi-bit input trimming regulation signal, and that sets in the comparator section the comparison duration according to the magnitude of the selected comparison value; and
   a regulation section that, based on the comparison result of the comparator section, regulates the oscillation frequency of the oscillation circuit such that the oscillation frequency that is measured by the measuring section becomes a target oscillation frequency.

2. The oscillation frequency regulating circuit of claim 1, wherein the setting section:
   sets a first comparison value of a small value and a first comparison duration of a short length until a number of times of regulation of the oscillation frequency by the regulation section equals a specific number of times; and
   sets a second comparison value greater than the first comparison value and a second comparison duration longer than the first comparison duration when the number of times of regulation has exceeded the specific number of times.

3. The oscillation frequency regulating circuit of claim 1, wherein the regulation section:
   causes the oscillation circuit to oscillate at an intermediate regulation frequency between a maximum regulation frequency and a minimum regulation frequency;
   regulates so as to oscillate at regulation frequency between the maximum regulation frequency and the intermediate regulation frequency and to oscillate to gradually approach the target oscillation frequency each time regulation is performed when the comparison result indicates that the measured oscillation frequency is less than the set comparison value; and
   regulates so as to oscillate at regulation frequency between the minimum regulation frequency and the intermediate regulation frequency and to oscillate to gradually approach the target oscillation frequency each time regulation is performed when the comparison result indicates that the measured oscillation frequency is the set comparison value or greater.

4. The oscillation frequency regulating circuit of claim 3, wherein the regulation section employs the trimming regulation signal configured from a bit string of m-bits to regulate the oscillation frequency of the oscillation circuit, and performs regulation repeatedly m times employing $2^m$ individual values of the trimming regulation signal, m being an integer that is equal to or greater than 2.

5. The oscillation frequency regulating circuit of claim 4, wherein the setting section sets the comparison value and the comparison duration for setting in the comparator section based on a value of the higher order bits in the trimming regulation signal input from an external device that is shifted in sequence one bit at a time from a higher order bit to a lower order bit each regulation duration.

6. A semiconductor device comprising:
   the oscillation frequency regulating circuit and the oscillation circuit of claim 1; and
   a processor that performs operation control of the oscillation frequency regulating circuit and the oscillation circuit.

7. An electronic device comprising:
   the semiconductor device of claim 6; and
   a sensor.

8. A method of regulating an oscillation frequency comprising:
   measuring an oscillation frequency of an oscillation circuit;
   selecting a single comparison value from a plurality of comparison values of different magnitudes responsive to higher order bits of a multi-bit input trimming regulation signal, and setting a comparison duration according to the magnitude of the selected comparison value;
   comparing the oscillation frequency measured by the measuring with the comparison value set by the setting over the comparison duration set by the setting; and
   regulating the oscillation frequency of the oscillation circuit such that the oscillation frequency measured by the measuring becomes a target oscillation frequency.

* * * * *